United States Patent
Wu

Patent Number: 6,137,137
Date of Patent: Oct. 24, 2000

[54] CMOS SEMICONDUCTOR DEVICE COMPRISING GRADED N-LDD JUNCTIONS WITH INCREASED HCI LIFETIME

[75] Inventor: David Wu, San Jose, Calif.

[73] Assignee: Advanced Micro Devices, Inc., Sunnyvale, Calif.

[21] Appl. No.: 08/924,644

[22] Filed: Sep. 5, 1997

[51] Int. Cl.$^7$ ................................................. H01L 29/76
[52] U.S. Cl. ............................................ 257/336; 257/344
[58] Field of Search .................................... 257/408, 336, 257/344, 305

[56] References Cited

U.S. PATENT DOCUMENTS

| 5,422,506 | 6/1995 | Zamapian | 257/344 |
| 5,565,700 | 10/1996 | Chou et al. | 257/408 |

OTHER PUBLICATIONS

D. Nayak, et al., in "A Comprehensive Study of Performance and Reliability of P, As, and Hybrid As/p N–LDD Junctions for Deep–Submicron CMOS Logic Technology," IEEE Electron Device Letters, vol. 18, No. 6, 1997, pp. 281–283.

*Primary Examiner*—Carl Whitehead, Jr.
*Assistant Examiner*—Roy Potter

[57] ABSTRACT

A CMOS semiconductor device is formed having an N-channel transistor comprising a source/drain region and an N-LDD region with a graded junction. The graded N-LDD junction is obtained by implanting a high diffusivity N-type impurity, such as P, after the N-LDD implant, e.g., As, subsequent to sidewall spacer formation. Upon activation annealing to form the N-channel transistor source/drain regions, P diffuses to a greater depth than As, thereby forming a deeper and graded N-LDD junction.

11 Claims, 3 Drawing Sheets

CMOS SEMICONDUCTOR DEVICE COMPRISING GRADED N-LDD JUNCTIONS WITH INCREASED HCI LIFETIME

TECHNICAL FIELD

The present invention relates to a method of manufacturing a semiconductor device with an increased hot carrier injection lifetime. The invention has particular applicability in manufacturing high density CMOS semiconductor devices with design features of 0.25 microns and under.

BACKGROUND ART

The escalating requirements for high densification and performance associated with ultra large scale integration semiconductor devices require design features of 0.25 microns and under, such as 0.18 microns and under, increased transistor and circuit speeds, high reliability and increased manufacturing throughput for competitiveness. The reduction of design features to 0.25 microns and under challenges the limitations of conventional semiconductor manufacturing technology.

The aggressive scaling of gate electrode dimensions into the deep submicron regime, such as less than about 0.25 microns, demands extremely shallow junctions in order to maintain good short channel characteristics and current drive. For example, semiconductor devices having design features of about 0.25 microns require a significantly reduced lightly doped drain (LDD) junction depth ($X_j$) of less than about 800 Å. Conventional methodology comprises ion implanting an N-type impurity having a low diffusion coefficient, typically arsenic (As). However, the formation of a sharp N-type impurity (N)-LDD junction requires the power supply voltage ($V_{dd}$) to be reduced in order to maintain sufficient hot carrier reliability. While attractive from a power dissipation standpoint, a lower $V_{dd}$ compromises speed and current drive required for microprocessors particularly for desktop applications. Thus, hot carrier injection (HCI) reliability has become the limiting factor for performance of N-channel MOSFETs, particularly as the design rules shrink. A reduction in the HCI lifetime is attributed to the sharp N-LDD junction which results in a high peak electric field in the channel region.

D. Nayak et al., in "A Comprehensive Study of Performance and Reliability of P, As, and Hybrid As/P N-LDD Junctions for Deep-Submicron CMOS Logic Technology," IEEE Electron Device Letters, Vol. 18, No. 6, 1997, pp. 281–283, disclose a method of N-LDD junction grading to decrease the peak electric field in the channel, thereby improving the HCI lifetime. The disclosed technique comprises ion implanting As and P to form the N-LDD implant. While this technique was reported to improve the HCI lifetime in semiconductor devices having 0.35 micron technology, such a hybrid As/P-LDD technique cannot be directly applied to semiconductor devices having design features of about 0.25 microns and below, because the Off-current is increased to an unacceptably high level.

In copending application Ser. No. 08/923,996 filed on Sep. 5, 1997, a method of reducing capacitance loading is disclosed wherein a rapidly diffusing N-type impurity, such as P, is implanted into the source/drain region employing a double spacer technique. In copending application Ser. No. 08/979,364 filed on Nov. 26, 1997, a method of forming a graded N-LDD junction is disclosed, which method comprises plural ion-implantations at different dosages and different angles to the semiconductor substrate.

There exists a need for semiconductor methodology and devices wherein the HCI lifetime of a MOSFET is increased without increasing the Off-current. There exists an even greater need for semiconductor methodology and devices having a design rule of about 0.25 microns and under with an increased HCI lifetime without an attendant increased Off-current.

DISCLOSURE OF THE INVENTION

An object of the present invention is a method of manufacturing a semiconductor device exhibiting an improved HCI lifetime and a graded N-LDD-source/drain junction.

Another object of the present invention is a semiconductor device exhibiting an increased HCI lifetime and a graded N-LDD-source/drain region junction.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, comprising: forming a dielectric layer on a surface of a semiconductor substrate; forming a conductive layer on the dielectric layer; patterning to form a gate electrode, having side surfaces, on the surface of the semiconductor substrate with a gate dielectric layer therebetween; using the gate electrode as a mask, implanting a first N-type impurity to form a first N-type lightly doped drain (N-LDD) implant in an N-channel transistor region of the semiconductor substrate; forming a sidewall spacer on the side surfaces of the gate electrode; using the gate electrode and sidewall spacers as a mask, implanting the first N-type impurity to form a moderately or heavily doped implant in the semiconductor substrate; using the gate electrode and sidewall spacer as a mask, implanting a second N-type impurity, different from the first N-type impurity, to form a second N-type impurity implant in the semiconductor substrate; and activation annealing to form a moderately or heavily doped source/drain region of the N-channel transistor extending to a first depth below the surface of the semiconductor substrate and an N-LDD region adjoining the source/drain region and comprising: a first N-LDD portion, containing the first N-type impurity, extending to a second depth less than the first depth; and a second N-LDD portion, containing the second N-type impurity, extending to a third depth greater than the second depth.

Another aspect of the present invention is a CMOS semiconductor device having N- and P-channel transistors, the N-channel transistor comprising: a moderately or heavily doped source/drain region extending to a first depth below a surface of a semiconductor substrate; a lightly doped drain (N-LDD) region adjoining the source/drain region and comprising: a first N-LDD portion, containing a first N-type impurity, extending to a second depth less than the first depth; and a second N-LDD portion, containing a second N-type impurity different from the first N-type impurity, extending to a third depth greater than the second depth.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifi-

BEST MODE FOR CARRYING OUT THE INVENTION

The present invention enables the manufacture of semiconductor devices exhibiting a longer HCI lifetime without an attendant increase in the Off-current. In fact, the present invention enables a tenfold increase in the HCI lifetime with an attendant reduction in the Off-current even in MOSFETs having a design rule of about 0.25 microns and under.

The hybrid As/P N-LDD junctions reported in the previously mentioned Nayak et al. publication achieve an increase in HCI lifetime at the cost of an undesirable increase in the Off-current. However, in deep submicron technology of about 0.25 microns and under, the attendant increase in Off-current is unacceptable for product design.

In accordance with the present invention, the HCI lifetime is increased without an attendant increase in the Off-current. In fact, the present invention provides a decrease in the Off-current and an increase in N-channel transistor performance with a tenfold increase in HCI lifetime, even in semiconductor devices having design features of about 0.25 microns and under. These objectives are achieved by implanting a relatively rapidly diffusing N-type impurity, such as P, in the source/drain region after the N-source/drain implant subsequent to sidewall spacer formation. Upon activation annealing, the rapidly diffusing impurity (P) has a greater distance to travel to reach the channel region vis-a-vis the previously disclosed technique of Nayak et al. and, hence, does not diffuse into the channel region during subsequent thermal cycles. In an embodiment of the present invention, the N-type impurity employed to form the N-LDD region and the source/drain region is As, and the rapidly diffusing impurity is P.

Figure 1:
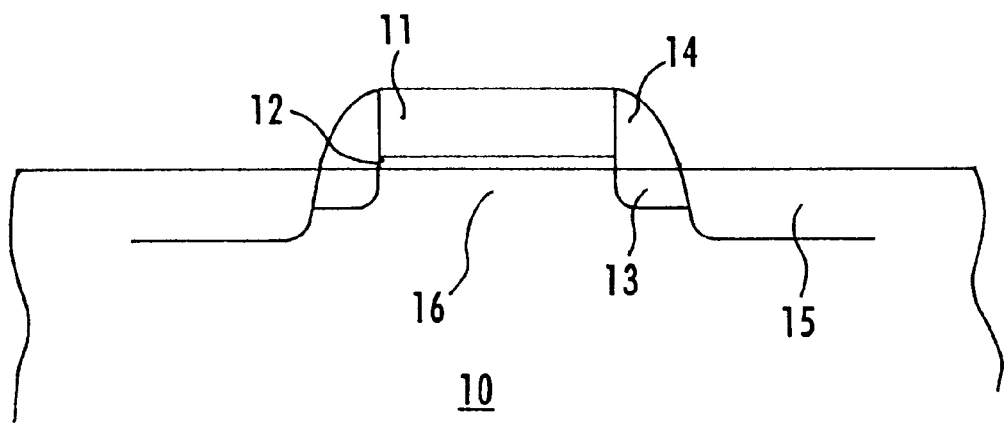
FIG. 1 schematically illustrates a conventional N-LDD-source/drain region junction.

Adverting to FIG. 1, a conventional N-channel transistor comprises substrate 10 and gate electrode 11 formed thereon with gate oxide layer 12 therebetween. An N-LDD implant, for subsequently activated N-LDD region 13, is formed by ion implantation using the gate electrode as a mask, usually As because of its low diffusion coefficient, typically at an implantation dosage of about $1\times10^{14}$ atoms/cm$^{-2}$ to about $1\times10^{15}$ atoms/cm$^{-2}$ at an energy of about 20 KeV to about 30 KeV. Sidewall spacer 14 is then formed on the side surfaces of gate electrode 11 and ion implantation is conducted to form the source/drain region implant for the adjoining subsequently activated N-source/drain region 15 by ion implanting As at an implantation energy of about $1\times10^{15}$ atoms/cm$^{-2}$ to about $5\times10^{15}$ atoms/cm$^{-2}$ at an energy of about 40 KeV to about 60 KeV. Activation annealing is then conducted at a temperature of about 1,000° C. to about 1,100° C. for about 10 seconds to about 60 seconds, to activate the N-LDD and source/drain regions. The HCI lifetime of such a conventional N-channel transistor is undesirably low due to a high peak electric field in the channel region caused by the sharp junction between N-LDD region 13 and channel region 16 under the gate electrode.

Figure 2:
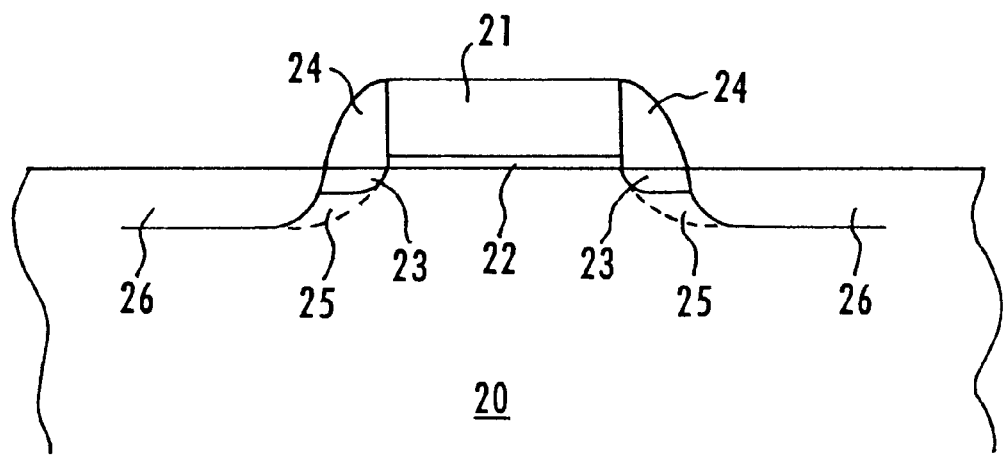
FIG. 2 illustrates an embodiment in accordance with the present invention.

The present invention enables the manufacture of a semiconductor device comprising an N-channel transistor having a significantly improved HCI lifetime without an attendant reduction in Off-current while improving transistor performance. In accordance with the present invention, adverting to FIG. 2, gate electrode 21 of an N-channel transistor is formed on the semiconductor substrate 20 with a gate dielectric layer 22 therebetween. Typically, the semiconductor substrate comprises doped monocrystalline silicon, the dielectric layer comprises silicon oxide and the gate electrode comprises doped polycrystalline silicon. N-type impurities are ion implanted to semiconductor substrate 20, employing gate electrode 21 as a mask, to form an N-LDD implant. Sidewall spacer 24 is then formed on the side surfaces of the gate electrode 21. Sidewall spacer 24 can comprise an insulating material, such as a silicon oxide, a silicon nitride or a silicon oxynitride. Sidewall spacer 24 is formed at a suitable width for optimum N-LDD junction characteristics. For example, it was found suitable to form sidewall spacer 24 at a width of about 500 Å to about 700 Å.

After formation of sidewall spacer 24, a second N-type impurity is implanted, different from the first N-type impurity employed to form the N-LDD implant. Typically, the first N-type impurity employed to form the N-LDD implant is As. Subsequent to formation of sidewall spacer 24, an N-type impurity, such as the first N-type impurity (As), is implanted to form the source/drain implant, i.e., a moderately or heavily doped implant. Typically, the moderately or heavily doped N-type implants are formed at an implantation energy of about $1\times10^{15}$ atoms/cm$^{-2}$ to about $5\times10^{15}$ atoms/cm$^{-2}$ at an energy of about 40 KeV to about 60 KeV. The second N-type impurity has a diffusivity greater than the diffusivity of As, such as P. The second N-type impurity, P, is ion implanted at suitable implantation conditions, such as an implantation dosage of about $1\times10^{13}$ atoms/cm$^{-2}$ to about $1\times10^{14}$ atoms/cm$^{-2}$ at an energy of about 20 KeV to about 40 KeV. The second N-type impurity, e.g., P, and the first N-type impurity to form the moderately or heavily doped implants, e.g., As, can be implanted in any order.

Subsequent to forming the implants by ion implantation, activation annealing is conducted to form the N-LDD region 23 and moderately or heavily doped N source/drain region 26. Activation annealing is typically conducted at a temperature of about 1,000° C. to about 1,100° C. for a period of time of about 10 seconds to about 60 seconds. The resulting N-LDD region comprises a first portion 23 containing As and extending to a first depth below the surface of the semiconductor substrate which is less than the depth to which source/drain region 26 extends. A graded junction is achieved, thereby decreasing the peak electric field in the channel, by virtue of the high diffusivity of the second N-type impurity (P) which forms a second portion 25 of the N-LDD region. The second N-LDD portion 25 forms a graded N-LDD junction by providing a gradual N-type impurity concentration gradient between, and extending into, the source/drain region 26 and N-LDD region 23. The second N-LDD portion 25 extends to below the first N-LDD portion 23 but not necessarily below the depth of source/drain region 26. Typically, the first N-LDD portion 23 extends to a depth of about 800 Å to about 1,000 Å, e.g., about 900 Å, the second N-LDD portion 25 extends to a depth of about 1,000 Å to about 1,500 Å, e.g., about 1,200 Å, and the source/drain region 26 extends to a depth of about 1,200 Å to about 1,800 Å, e.g., about 1,500 Å.

Thus, in accordance with the present invention, a rapidly diffusing N-type impurity, such as P, is introduced into the As source/drain region with an attendant reduction in the substrate current without an increase in the Off-current. The present invention achieves a higher drain saturation current at a fixed level of the Off-current, thereby improving MOSFET performance. It was also found that the implantation of P after formation of the As source/drain region can reduce the LDD series resistance, especially the source side resistance, to obtain improved performance of the N-channel transistor. The exact mechanism leading to the advantages obtained by the present invention is not known. However, it is believed that the rapidly diffusing N-type impurity (P) implanted into an N-LDD region, as reported by Nayak et al., easily diffuses into the channel region during subsequent thermal cycles; whereas, in accordance with the present invention, P implanted into the As source/drain region avoids a post-LDD oxidation cycle and has a greater distance to diffuse laterally before getting to the channel. Accordingly, an increase in Off-current is avoided.

Figure 3:
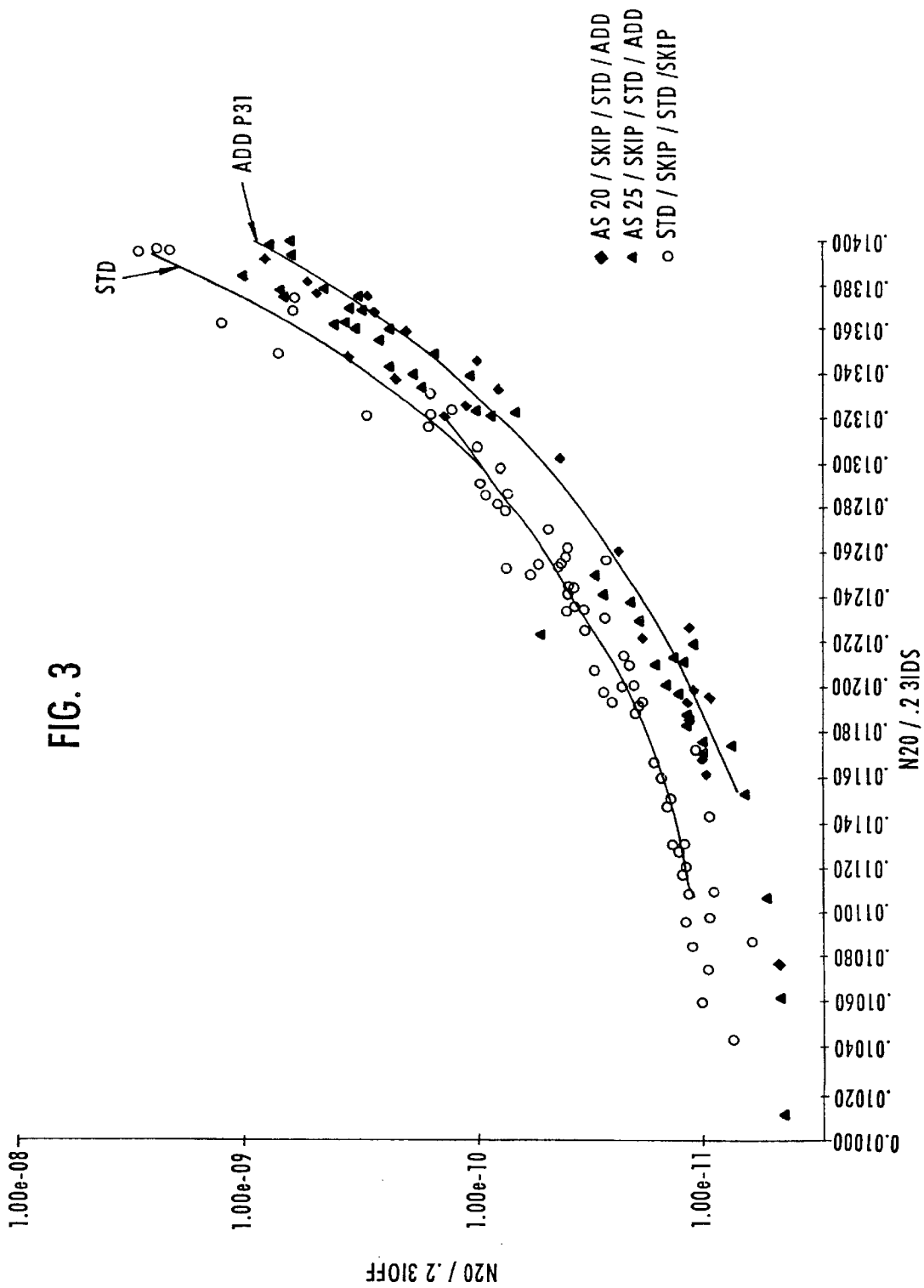
FIGS. 3 and 4 are graphs illustrating advantages of the present invention in reducing the substrate current.
Figure 4:
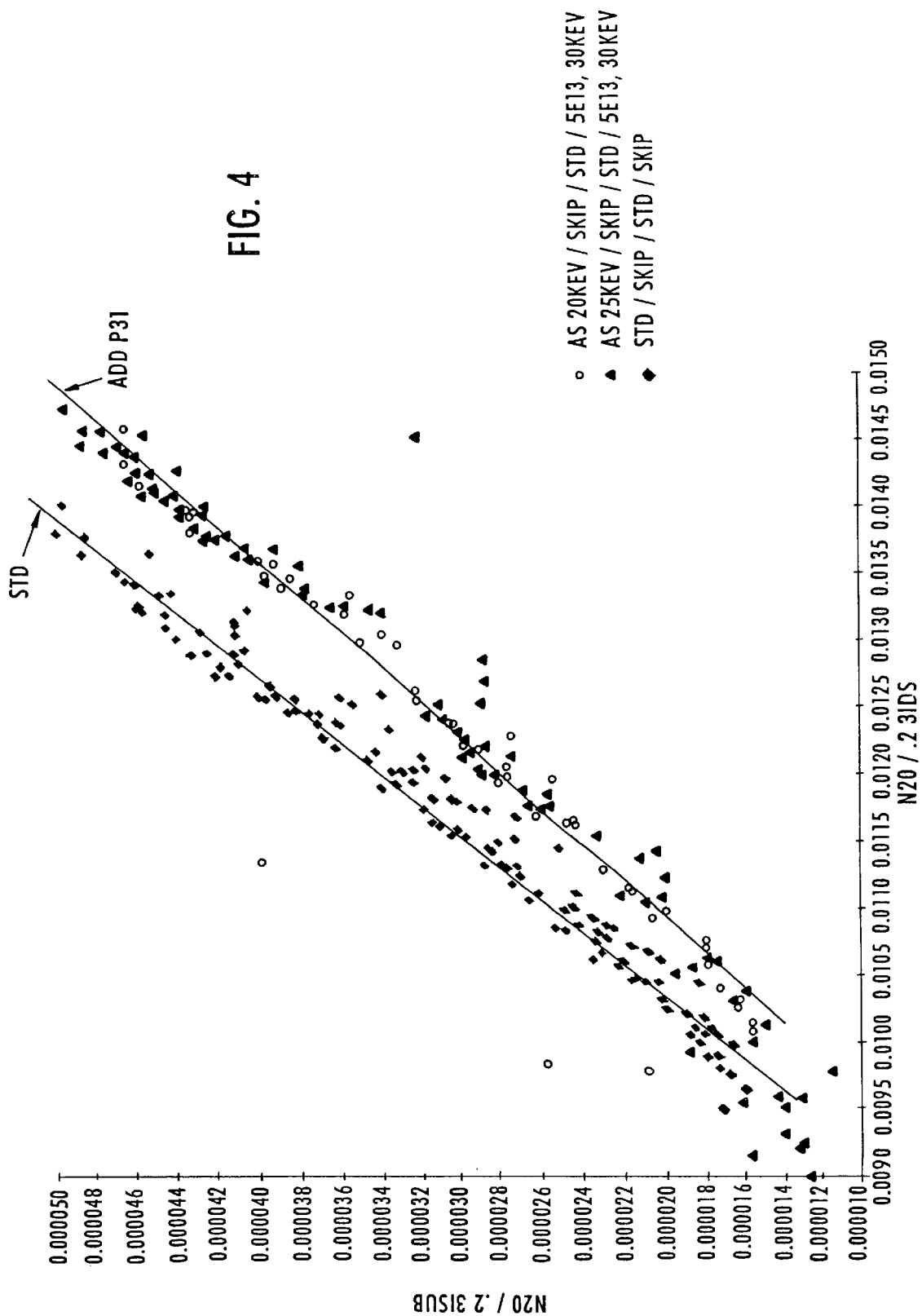

Experiments were conducted to determine the impact of the present invention on HCI lifetime which is proportional to the substrate current ($I_{sub}$) As was employed as the first N-type impurity and P as the second N-type impurity. As was ion implanted to form an N-LDD implant at an implantation dosage of about $1 \times 10^{14}$ atoms cm$^{-2}$ and at an implantation energy of about 20–25 KeV. After formation of a sidewall spacer having a width of about 700 Å, As was also implanted to form the moderately or heavily doped source/drain implant at an implantation dosage of about $4 \times 10^{15}$ atoms cm$^{-2}$ and at an implantation energy of about 50 KeV. Also after sidewall spacer formation, P was ion implanted at an implantation dosage of about $5 \times 10^{13}$ atoms cm$^{-2}$ and at an implantation energy of about 30 KeV. As shown in FIGS. 3 and 4, which compare the present invention to a standard split, the present invention results in a $I^{sub}$ reduction due to the graded N-LDD junction and, hence, a decrease in the peak electric field in the channel region with an attendant increase in HCI lifetime.

Thus, the present invention enables the manufacture of semiconductor devices comprising an N-channel transistor having improved HCI lifetime, e.g., about a tenfold increase in the HCI lifetime, without an attendant increase in the Off-current, even with a decrease in the Off-current, and improved transistor performance. The present invention comprises ion implanting a rapidly diffusing N-type impurity, such as P, into the source/drain implant after sidewall spacer formation. After activation annealing, a graded N-LDD junction is formed, thereby decreasing the peak electric field in the channel region and with an attendant increase in HCI lifetime. The present invention is applicable to production of various types of semiconductor devices, particularly high density semiconductor devices with submicron features of about 0.25 microns and below, exhibiting high speed characteristics and improved reliability. The present invention is cost effective and can easily be integrated into conventional processing.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A CMOS semiconductor device having N- and P-channel transistors, the N-channel transistor comprising:
   a gate electrode overlying a substrate with a gate dielectric layer therebetween;
   a channel region in the substrate under the gate electrode moderately or heavily doped source/drain region extending to a first depth from a surface of a semiconductor substrate; and
   a lightly doped drain (N-LDD) region adjoining the source/drain region and comprising:
      a first N-LDD portion, containing a first N-type impurity, extending to a second depth less than the first depth; and
      a second N-LDD portion, containing a second N-type impurity different from and having a greater diffusion coefficient than the first N-type impurity, extending to a third depth greater than the second depth, wherein the second N-type impurity does not extend to the channel region.

2. The semiconductor device according to claim 1, wherein the second N-LDD portion forms a graded N-LDD junction by providing a gradual N-type impurity concentration gradient between, and extending into, the channel region and the N-LDD region.

3. The semiconductor device according to claim 1, wherein the semiconductor device is a CMOS semiconductor device comprising N- and P-channel transistors having design features of 0.25 microns and under.

4. The semiconductor device according to claim 3, wherein the N- and P-channel transistors comprise design features of about 0.18 microns and under.

5. The semiconductor device according to claim 1, wherein the gate dielectric layer comprises a silicon oxide, and the substrate comprises doped monocrystalline silicon.

6. The semiconductor device according to claim 5, wherein the gate electrode comprises doped polycrystalline silicon.

7. The semiconductor device according to claim 1, wherein the first N-type impurity comprises arsenic, and the second N-type impurity comprises phosphorous.

8. The semiconductor device according to claim 1, further comprising a silicon oxide, a silicon nitride or a silicon oxynitride sidewall spacer on side surfaces of the gate electrode.

9. The semiconductor device according to claim 1, wherein the sidewall spacer has a width of about 500 Å to about 700 Å.

10. The semiconductor device according to claim 1, wherein the third depth is about 1,000 Å to about 1,500 Å.

11. The semiconductor device according to claim 1, wherein the moderately or heavily doped implants comprise the first N-type impurity.

* * * * *